United States Patent [19]

Morimura et al.

[11] Patent Number: 5,763,838
[45] Date of Patent: Jun. 9, 1998

[54] APPARATUS FOR WEIGHING A GROWN CRYSTAL

[75] Inventors: Toshiaki Morimura; Yoshitaka Noguchi; Satoshi Oka, all of Tokyo, Japan

[73] Assignee: Ohkura Electric Co., Ltd., Tokyo, Japan

[21] Appl. No.: 737,412

[22] PCT Filed: Mar. 14, 1996

[86] PCT No.: PCT/JP96/00632

§ 371 Date: Oct. 23, 1996

§ 102(e) Date: Oct. 23, 1996

[87] PCT Pub. No.: WO96/30729

PCT Pub. Date: Oct. 3, 1996

[30] Foreign Application Priority Data

Mar. 27, 1995 [JP] Japan ................... 7-068454

[51] Int. Cl.$^6$ ............... G01G 19/00; C30B 23/00
[52] U.S. Cl. ............ 177/147; 177/245; 177/253; 177/DIG. 9; 117/201
[58] Field of Search .................. 177/147, 154, 177/155, 156, 184, 187, 189, 244, 245, 253, DIG. 9; 117/201, 202

[56] References Cited

U.S. PATENT DOCUMENTS

| | | | |
|---|---|---|---|
| 3,259,467 | 7/1966 | Rummel | 177/147 |
| 3,323,606 | 6/1967 | Burns et al. | 177/147 |
| 3,587,760 | 6/1971 | Puhringer et al. | 177/146 |
| 4,503,921 | 3/1985 | Polen et al. | 177/147 |
| 4,916,955 | 4/1990 | Katsuoka et al. | 117/201 |
| 5,172,782 | 12/1992 | Yoo et al. | 177/147 |
| 5,345,042 | 9/1994 | Jamieson | 177/147 |

FOREIGN PATENT DOCUMENTS

| | | |
|---|---|---|
| 293757 | 12/1988 | European Pat. Off. . |
| 303977 | 2/1989 | European Pat. Off. . |
| 2541315 | 8/1984 | France . |
| 2516197 | 10/1976 | Germany . |
| 3408071 | 9/1985 | Germany . |
| 2180357 | 3/1987 | United Kingdom . |
| 8808786 | 11/1988 | WIPO . |

OTHER PUBLICATIONS

"Overload Protection in Electronic Weighing Systems: Part 5", *Measurment and Control*, vol. 12, By Al Brendel, p. 471, Nov. 1979.

*Primary Examiner*—Michael L. Gellner
*Assistant Examiner*—Randy W. Gibson
*Attorney, Agent, or Firm*—Iandiorio & Teska

[57] ABSTRACT

The disclosed apparatus weighs a grown crystal that is being pulled from melt thereof. The lower end of a rope of known weight is connected to the crystal, while the upper end of the rope is connected to the drum of a rope-winding unit. The rope-winding unit includes a driver coupled to the drum so as to rotate the drum and wind the rope thereon, and the weight of the rope-winding unit including the drum and driver is known. At least one weight sensor is coupled to the rope-winding unit so as to measure the magnitude of gravity acting on the rope-winding unit. Whereby, the weight of the grown crystal is determined by subtracting the sum of the known weights of the rope and the rope-winding unit from the measured magnitude of the gravity acting on the rope-winding unit.

18 Claims, 11 Drawing Sheets

APPARATUS FOR WEIGHING A GROWN CRYSTAL

TECHNICAL FIELD

This invention relates to an apparatus for weighing a grown crystal, and in particular, to an apparatus for weighing the weight of a crystal which is growing by being pulled from a melt thereof.

BACKGROUND ART

As a method for producing monocrystal of silicon semiconductor and the like, Czochralski Process is used in which a seed crystal is dipped in a melt of a semiconducting material and the like and then pulled up while being rotated so as to grow the monocrystal. In an apparatus for producing crystal based on the Czochralski Process, in order to control the size of the monocrystal being grown (to be referred to as a "grown crystal") through the pulling, the cross-sectional area or the diameter of the grown crystal at the boundary surface between the melt and the grown crystal (to be referred to as "boundary surface") is measured. Based on the measured value of the cross-sectional area or the diameter, the speed of pulling the seed crystal and the temperature of the melt are controlled so as to produce the desired diameter of the grown crystal. Conventional method to measure the diameter of the grown crystal at the boundary surface is, for instance, an image measurement method in which the diameter of a grown crystal is determined based on its image obtained by a television (TV) camera, or a method in which weight increment of the grown crystal is measured and its diameter is calculated on the basis of the measured weight increment.

Figure 9A:
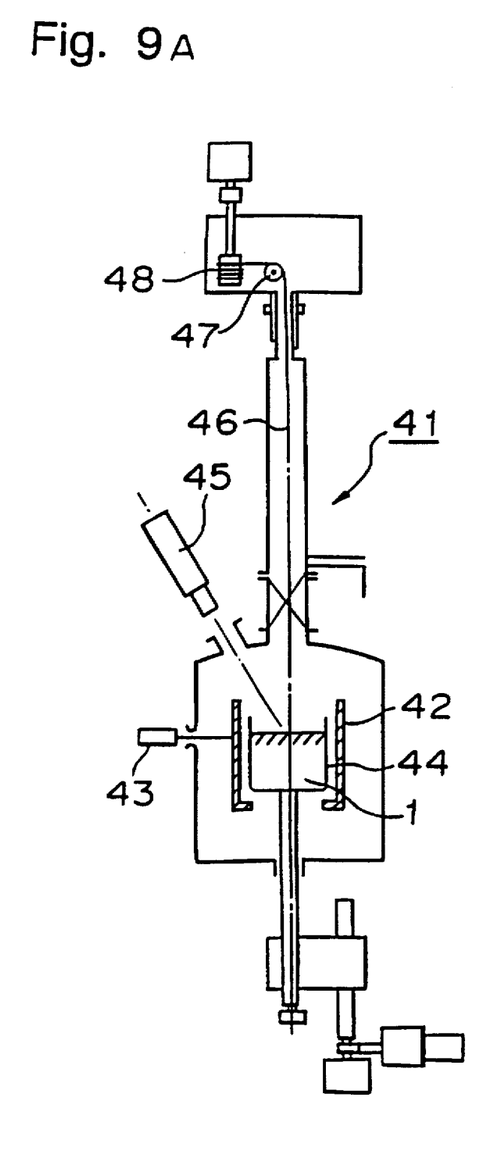
FIG. 9 shows a conventional wire-type machine for producing crystal.

The FIG. 9(A) shows an example of conventional wire-type apparatus 41 for producing monocrystal. With the apparatus 41 of FIG. 9(A), a heater 42 heats melt 1 in a crucible 44, and a seed crystal secured to the lower end of a wire rope 46 having its upper end connected to a drum 48 depends by way of a pulley 47 located above the crucible 44 and is dipped in the melt 1. Being slowly wound up onto the drum 48, the wire rope 46 ascends gradually, and its lower end is slowly pulled up from the melt 1 so as to form and develop a grown crystal 3. In the illustrated example, a temperature sensor 43 measures the temperature of the heater 42. The apparatus 41 of FIG. 9(A) has a TV camera 45 for taking picture of the inside of the crucible 44, the boundary between the melt 1 and the grown crystal 3 in particular, for facilitating the determination of the diameter of the grown crystal 3 based on the picture or image obtained by the TV camera 45.

Figure 9B:
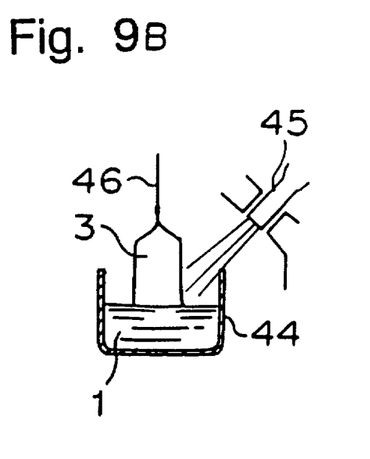
Figure 9C:
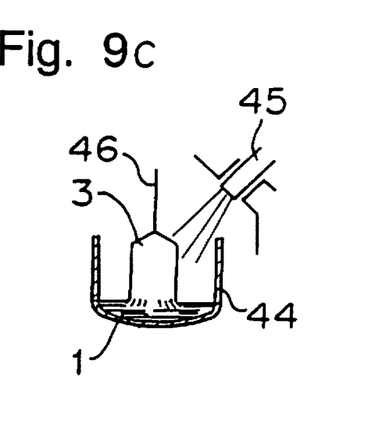

The conventional image method of determining the diameter of the grown crystal 3 has a shortcoming in that, with the development of the grown crystal 3, the top surface level of the melt 1 in the crucible 44 is gradually lowered as shown in FIGS. 9(B) and 9(C). With the TV camera 45 at the fixed position, as the surface level is lowered, it becomes increasingly difficult to take picture of the melt surface or the above-mentioned boundary surface. Without the picture of the boundary surface, it is impossible in the image method to determine the diameter of the grown crystal 3 at the crystallizing point.

Figure 10A:
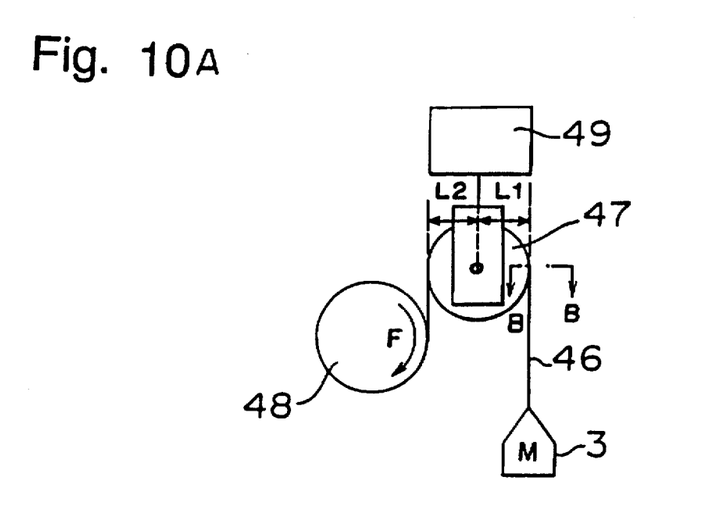
FIG. 10 shows the operating principles of a conventional apparatus for weighing a grown crystal.

To avoid the shortcoming of the image method, it has been proposed to measure the weight of the grown crystal 3 acting on the pulley 47 of FIG. 9 by using a load cell 49 as shown in FIG. 10(A). If it is assumed that the weight of the pulley 47 is negligible and the pulley 47 acts as a lever with two arm lengths $L_1$ and $L_2$, the output of the load cell 49 can be given by the following equation (1) as a function of the weight Mg of the grown crystal 3. When the arm lengths ratio ($L_1/L_2$) is known, one can get the weight Mg of the grown crystal 3 from the output of the load cell 49 by using the relationship of the equation (1). In the equation (1), F represents winding force of the drum 48, and $L_1$ and $L_2$ represent horizontal radii of the pulley 7 on the sides of the grown crystal 3 and the drum 48, respectively.

$$\text{(Load cell output)}=Mg+F=Mg+(MgxL_2/L_1)=Mg(1+L_2/L_1) \quad (1)$$

Figure 11:
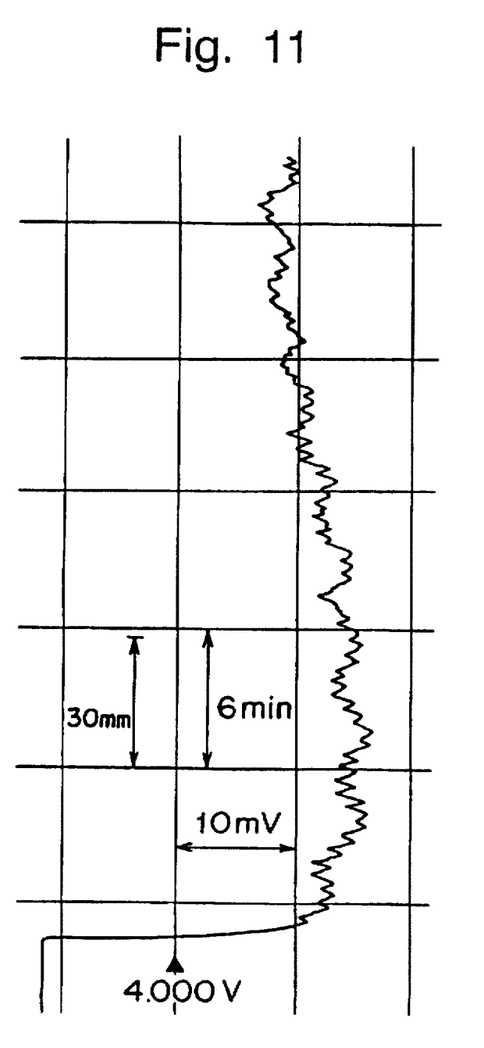
FIG. 11 is a graph showing the result of a measurement test made by using the conventional apparatus of FIG. 10.

The method of FIG. 10(A), however, has a shortcoming in that comparatively large measurement error is inevitable. To analyze such error, a test was made by connecting a weight member of 60 kg, instead of the grown crystal 3 of FIG. 10(A), to the lower end of the wire rope 46, and winding up the weight member at a speed of about 5 mm/minute, and the output from the load cell 49 was measured. The result is shown in FIG. 11. It is observed in FIG. 11 that the output from the load cell 49 of FIG. 10(A) contains wave-like noises of high-frequency and intermediate-frequency and that such noises tend to decrease gradually with the progress of the winding of the wire rope 46. The cause of the high-frequency wave-like noise seems to be in such irregular snarl or dislocation of the wire-rope 46 during the winding up which result in variation in the ($L_2/L_1$) ratio of the equation (1). On the other hand, the cause of the intermediate-frequency wave-like noise seems to be in such mechanical errors as deviation of the periphery of the pulley 49 from true circle and displacement between the axis of shaft journalling the pulley 47 and the center of the pulley 47. It appears that the gradual decrease of the above wave-like errors with the winding up of the weight member is due to the fact that the length of the wire rope 46 on the weight member side of the pulley 47 decreases as the wire rope 46 is taken up by the drum 48.

In short, the measuring method of FIG. 10(A) involves a large measurement error and accurate measurement of the weight of the grown crystal 3 cannot be expected. In view of such shortcoming, the conventional Czochralski Process actually uses a pulling rod, instead of the wire rope 46, to pull up the grown crystal 3. The use of the pulling rod, however, results in an increase of the apparatus size for facilitating the rod movement.

Figure 10B:
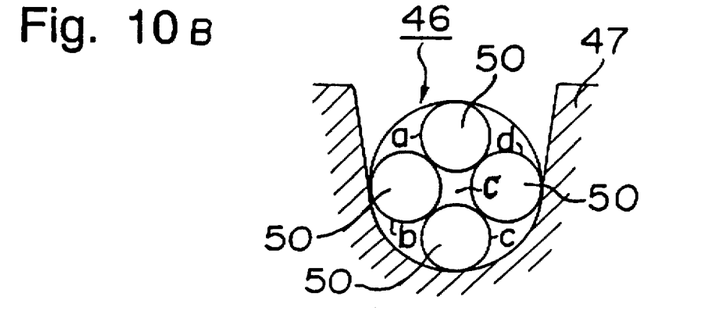
Figure 10C:
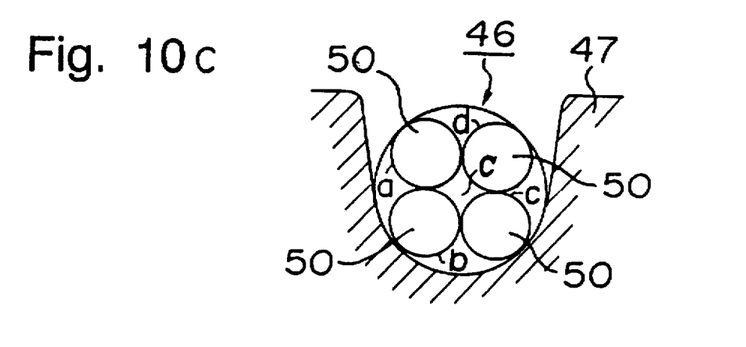

To cope with the high-frequency wave-like error, Japanese Patent Laying-open Publication No. 047914/1989 discloses an apparatus for measuring the pulling load of a grown crystal or a crystal rod, wherein cross-sectional shape of that portion of the guide groove of a pulley which engages wire rope suspending the crystal rod is curved with substantially the same radius of curvature as the radius of a circumscribed circle of the wire rope. In particular, referring to FIGS. 10(B) and 10(C), the invention of the above Publication No. 047914/1989 avoids measurement error of the load cell 49 due to irregular snarl or dislocation of the wire rope 46 having a plurality of strands 50, by making the radius of curvature of guide groove cross-sectional surface of the pulley 47 substantially the same as the radius of a circumscribed circle of the wire rope 46. However, one cannot expect elimination of the entire wave-like noise of FIG. 11 by the invention of the above Publication No. 047914/1989, because it can eliminate only the high-frequency wave-like noise but it cannot eliminate the intermediary-frequency wave-like noise.

Thus, an object of the present invention is to provide an apparatus for accurately weighing a grown crystal as being pulled by a wire.

DISCLOSURE OF INVENTION

The apparatus according to the invention measures the weight of a grown crystal that is being pulled from its melt.

The apparatus uses a rope of known weight having a lower end connected to the grown crystal, and a rope-winding unit of known weight including a drum connected to an upper end of the rope and a driver coupled to the drum so as to rotate the drum and wind the rope thereon. A weight-sensing means having at least one weight sensor is coupled to the rope-winding unit for measuring the magnitude of gravity acting on the rope-winding unit. With the apparatus of the present invention, the weight of the grown crystal is determined by subtracting the sum of the known weights of the rope and the rope-winding unit from the measured magnitude of gravity acting on the rope-winding unit. Hence, the present invention does not depend on the shapes and dimensions of any pulley or wire rope, so that all the wave-like errors due to dimensions of such pulley and wire rope are completely eliminated.

BRIEF DESCRIPTION OF DRAWINGS

For a better understanding of the invention, reference is made to the accompanying drawings, in which.

Like parts are designated by like numerals throughout different views of the drawings.

BEST MODE FOR CARRYING OUT THE INVENTION

Figure 1:
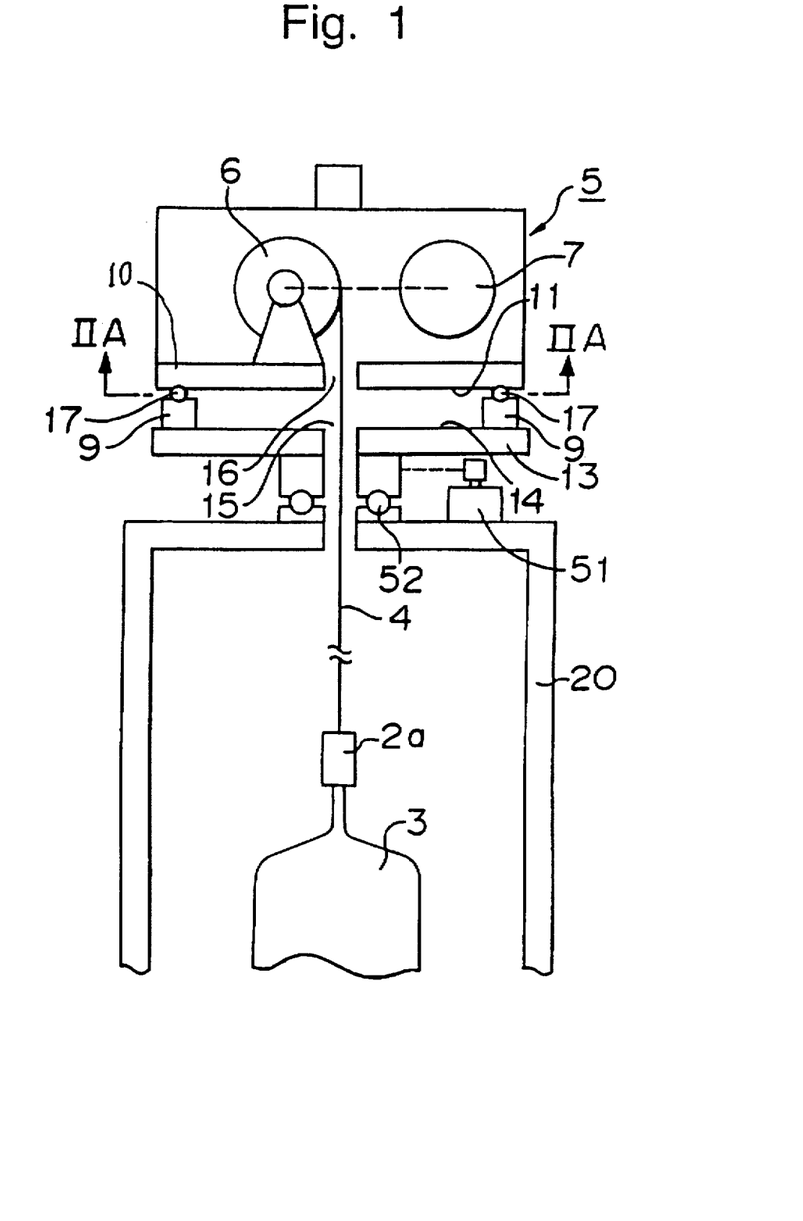
FIG. 1 is a diagrammatic sectional view showing the construction of an embodiment of the apparatus for weighing a grown crystal according to the invention.

Referring to FIG. 1 illustrating an embodiment, the apparatus according to the invention measures the weight of a grown crystal 3 as it is pulled up from its melt 1 (FIG. 9). The apparatus comprises a rope 4 of known weight having one end connected the grown crystal 3, a rope-winding unit 5 of known weight including a drum 6 for winding the rope 4 and a driver 7 for driving the drum 6, and a weight-measuring means including at least one weight sensor 9 which is coupled to the rope-winding unit 5 so as to measure the magnitude of gravity acting thereon. In the example shown in FIGS. 1 and 2, three weight sensors 9 are used in the weight-measuring means. The weight of the grown crystal 3 is determined by subtracting the sum of known weights of the rope 4 and the rope-winding unit 5 from the magnitude of the gravity as measured by the weight-measuring means.

Preferably, a holding-table 10 is provided in the rope-winding unit 5 so as to hold both the drum 6 and the driver 7 thereon, and the holding-table 10 is supported from below by one or more weight sensors 9 of the weight-sensing means.

In the embodiment of FIG. 1, the gravity measured by the weight-measuring means represents the total weight of the rope 4, the rope-winding unit 5 and the grown crystal 3 connected to the lower end of the rope 4. If the sum of the weights of the rope 4 and rope-winding unit 5 is represented by $\alpha$ and the weight of the grown crystal 3 is represented by $Mg$, the output from the weight-measuring means is given by the following equation (2). Since the sum $\alpha$ of the weights of the rope 4 and rope-winding unit 5 is known or can be determined before starting the weighing of the grown crystal, the weight $Mg$ of the grown crystal 3 can be determined by using the output from the weight-measuring means and the equation (2).

$$\text{(output from the weight-measuring means)} = Mg + \alpha \qquad (2)$$

It is preferable to use a load cell as the weight sensor 9 of the weight-measuring means. As shown in FIGS. 1 and 2, the rope-winding unit 5 can be supported by a plurality of the weight sensors 9, and in this case the magnitude of gravity $Mg$ acting on the rope-winding unit 5 in the equation (2) is given by the total output of all the weight sensors 9 supporting it. In the embodiment of FIG. 1, a holding-table 10 is provided in the rope-winding unit 5 so as to hold the drum 6 and the driver 7 thereon, and the weight sensors 9 support the holding-table 10 from below. The invention is, however, not limited to such holding-table 10 supporting the rope-winding unit 5 from below. The rope-winding unit 5 may be, for instance, suspended by a suitable hanging mechanism (not shown) including one or more weight sensors 9.

[Test Measurement]

Figure 8:
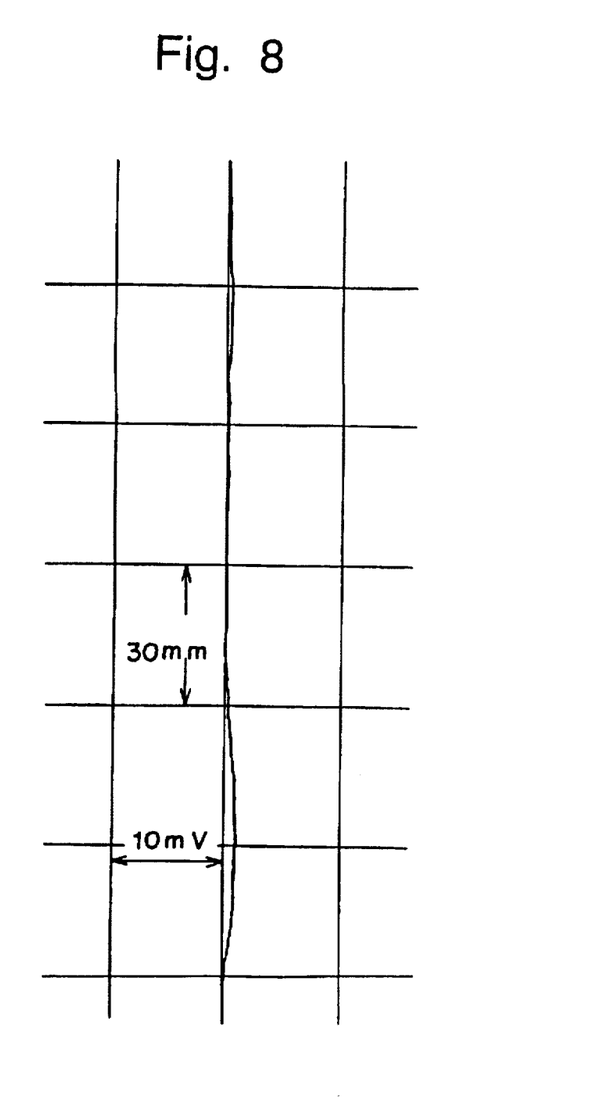
FIG. 8 is a graph showing the result of a measurement test carried out by using the apparatus of the invention.

With the weighing apparatus of FIG. 1, the grown crystal 3 at the lower end of the rope 4 was replaced by a 60 kg weight member, and the weight member was pulled up at a speed of about 5 mm/min by winding the rope 4. The output from the weight-measuring means consisting of the weight sensors 9 was recorded by plotting. The result is shown in the graph of FIG. 8. The comparison of the graphs in FIGS. 8 and 11 indicates that the output from the weight sensors 9 of the apparatus of the invention in FIG. 1 is free from wave-like noise due to the irregular snarl or dislocation of the rope 4 or machining error of the pulley 47 (FIG. 10). Further, the apparatus of the invention measures the weight of the entire length of the rope 4, and the output from the weight sensors 9 does not involve gradual diminishing due to reduction of length of that part of the rope 4 which depends from the drum 6. As can be seen from the graph of FIG. 8, the apparatus of the invention facilitates accurate measurement of the weight of the grown crystal 3, and the weight thus measured can be used for accurate determination of the radius of the grown crystal 3 at its boundary with the melt 1.

Therefore, the object of the invention is fulfilled in that an apparatus capable of accurately measuring the weight of a grown crystal being drawn by a wire is provided.

The invention will now be described in further detail by referring to different embodiments thereof. In the embodiment of FIG. 1, weight sensors 9 are secured to the mounting surface 14 of a mounting-platform 13, and a through hole 15 is bored through the mounting-platform 13 so as to allow the depending portion of the rope 4 to reciprocate vertically through such hole 15. A framework 20, which is fixed above the level of the melt 1, supports the mounting-platform 13 through a bearing 52 in such manner that the mounting-platform 13 can rotate about its own vertical axis passing the center of the through hole 15. The numeral 51 represents a motor for driving the mounting-platform 13 about its own center. Referring to FIGS. 1 and 2, a plurality of, for instance three, weight sensors 9 are secured to such positions of the mounting surface 14 of the platform 13 that the weight sensors 9 support the holding-table 10 while registering the depending portion of the rope 4 at the center of the through hole 15 of the platform 13.

Preferably, contact surfaces of suitable shape are formed at such portions of the lower surface of the mounting-table 10, such as radial grooves 19 of FIG. 2, and the top end of each weight sensor 9 engages the groove 19 either directly or indirectly. In the example of FIG. 2, the holding-table 10 is indirectly supported by the weight sensors 9. More specifically, an insert 17 with spherical surface portion is placed between the top end of each weight sensor 9 and the bottom surface 11 of the holding-table 10, and the spherical surface portion of the insert 17 comes into slidable contact with one or both of the table bottom surface 11 and top end of the weight sensor 9.

The rope-winding unit 5 in the embodiment of FIG. 1 includes the drum 6 and the driver 7 mounted on the top surface of the holding-table 10, and the rope 4 extends downwards through a hole 16 bored across the table 10. The mounting of the drum 6 and the driver 7 is not restricted to the top surface of the table 10. For instance, it is also possible to secure the drum 6 and the driver 7 to the bottom of the holding-table 10, and in this case the hole 16 through the table may be dispensed with. In the example of FIG. 2, the center of the hole 16 is designated as the center O for rotation, but in case of boring no hole 16, the cross point of the table 10 and the pulling direction of the rope 4 can be designated as the center for rotation.

Figure 2A:
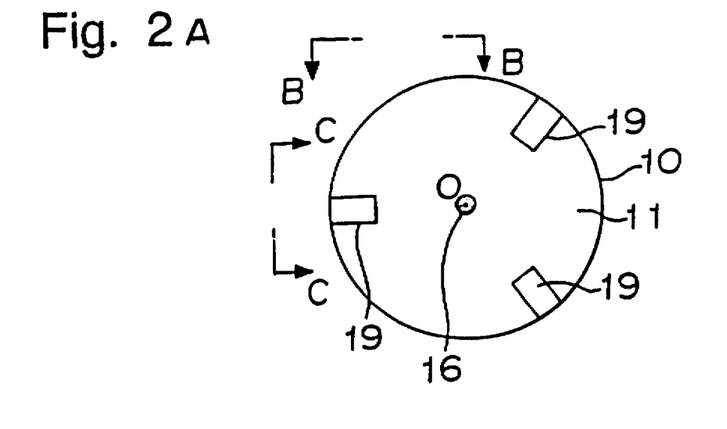
FIG. 2 shows an embodiment of the apparatus of the invention, in which grooves are formed on a holding-table to be supported by weight sensors.
Figure 2B:
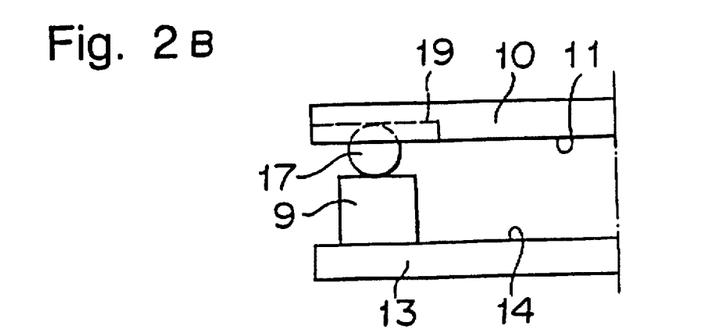
Figure 2C:
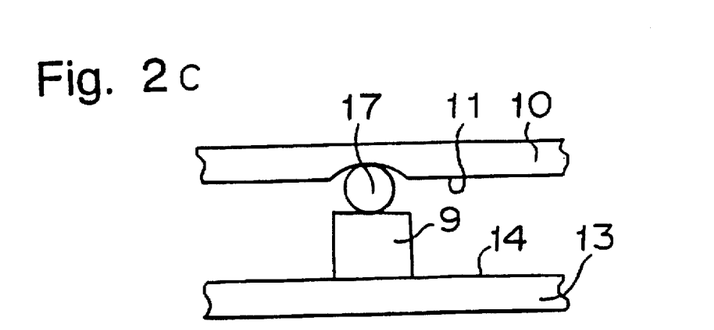

Views (A) through (C) of FIG. 2 illustrate how to keep the depending portion of the rope 4 at the center of the through hole 15 of the mounting-platform 13. Three grooves 19 with arcuate cross section are so formed on the bottom surface 11 of the holding-table 10 as to extend radially with respect to the center O of the hole 16. The holding-table 10 is supported by three weight sensors 9 with the insert 17 placed between each sensor 9 and the table 10 in such manner that, the spherical surface portion of the insert 17 comes into slidable contact with the arcuate surface of each of the three radial grooves 19 of the table 10.

When the inserts 17 with a spherical surface portion are not used, if relative position between the grooves 19 of the holding-table 10 and the weight sensors 9 is deviated in a direction traversing the radial direction of the groove 19, the holding-table 10 will be supported in an inclined fashion. Such inclined support of the holding-table 10 can produce a horizontal component in the load to the weight sensor 9, e.g., a load cell, which horizontal component can cause measurement error or fault of the weight sensor 9. On the other hand, when the insert 17 with a spherical surface portion is placed between the holding table 10 and the weight sensor 9 as shown in FIG. 2, the position of the holding-table 10 is automatically adjusted by its own weight so that spherical surface portion of the insert 17 comes into stable contact with the bottom portion of the arcuate groove 19, and the above-mentioned horizontal component of the load is prevented.

If the top end of the weight sensor 9 is received by a hole (not shown) of the holding-table 10 without using the above-mentioned combination of the groove 19 and the insert 17, the position of the weight sensor 9 must be adjusted very accurately, for instance with an allowance of less than about 10 µm. For positioning of the weight sensor 9 relative to the groove 19 of the holding-table 10, a suitable adjusting screw means (not shown) may be provided where the weight sensor 9 is mounted on the mounting-platform 13.

The embodiment of FIG. 3 uses a loading unit 24 which is formed on the bottom surface 11 of the holding-table 10 for each weight sensor 9. The loading unit 24 includes a horizontal rotary shaft 21 carried by the holding-table 10 so as to be rotatable about an axis that is tangential to a circle about the cross point O of the pulling direction of the rope 4 with the bottom surface 11 of the table 10, and a rotary block 22 that is integrally secured to lower part of the rotary shaft 21. In the example of FIG. 3, the insert 7 is placed between the loading unit 24 and the weight sensor 9, and the spherical surface portion of the insert 17 is brought into slidable contact with the rotary block 22 of the loading unit 24. A spherical recess (not shown) may be formed on the bottom surface of the rotary block 22, so as to allow slidable engagement of the spherical surface portion of the insert 17 with such spherical recess. Further, it is also possible to bring the top end of the weight sensor 9 into direct contact with the rotary block 22. The rotary shaft 21 of FIG. 3 is journalled by one or more brackets 23 which are integrally secured to the bottom surface 11 of the holding-table 10.

Figure 3A:
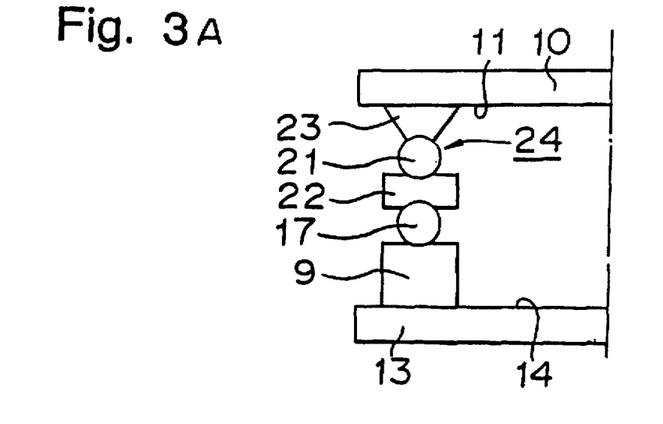
FIG. 3 shows another embodiment of the invention, in which one or more loading units are attached to the holding-table.
Figure 3B:
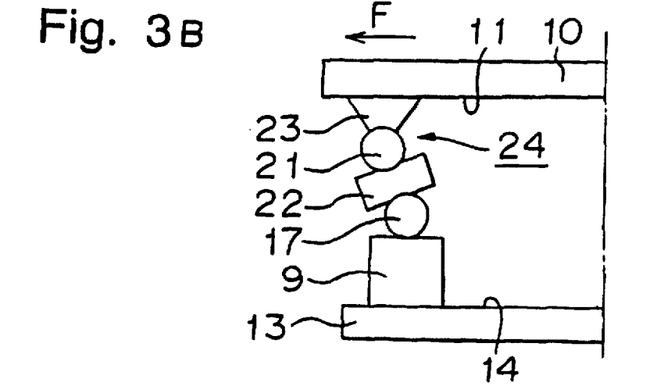
Figure 3C:
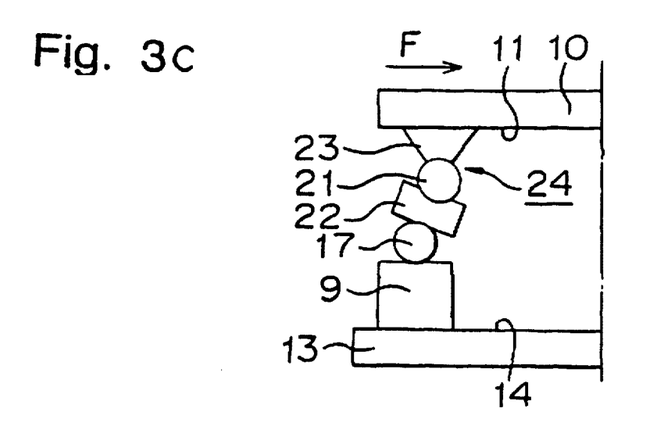

FIG. 3(A) shows the loading unit 24 at a position in vertical alignment with the weight sensor 9, while FIGS. 3(B) and 3(C) at outwardly and inwardly displaced positions with respect to the vertical alignment, respectively. The above displacements in FIGS. 3(B) and 3(C) are shown with a considerable exaggeration, and in actual apparatus, various parts of the apparatus are precisely machined and assembled accurately, and the displacement from the above vertical alignment is limited to a narrow range. As compared with the case of direct contact of the weight sensor 9 with the holding-table 10 without the loading unit 24, the insertion of the loading unit 24 reduces the magnitude of horizontal component of the vertical load to the weight sensor 9 even when deviation from the vertical alignment of FIG. 3(A) is caused, as can be expected from FIGS. 3(B) and 3(C). Consequently, the accuracy of the output from the weight sensors 9, such as load cells, can be kept high and long durability can be ensured. For a given accuracy of the output from the sensors 9, the allowable deviation of vertical alignment between the loading unit 24 and the weight sensor 9 is fairly large, for instance 0.5 to 1 mm, and the machining of the related parts becomes easier accordingly. In this embodiment, it is also preferable to make the securing position of the weight sensor 9 on the mounting-platform 13 adjustable, so that the alignment of the holding-table 10 and the weight sensor 9 can be accomplished by a combination of the radial direction adjustment of the loading unit 24 and the securing position adjustment of the weight sensor 9.

Figure 5:
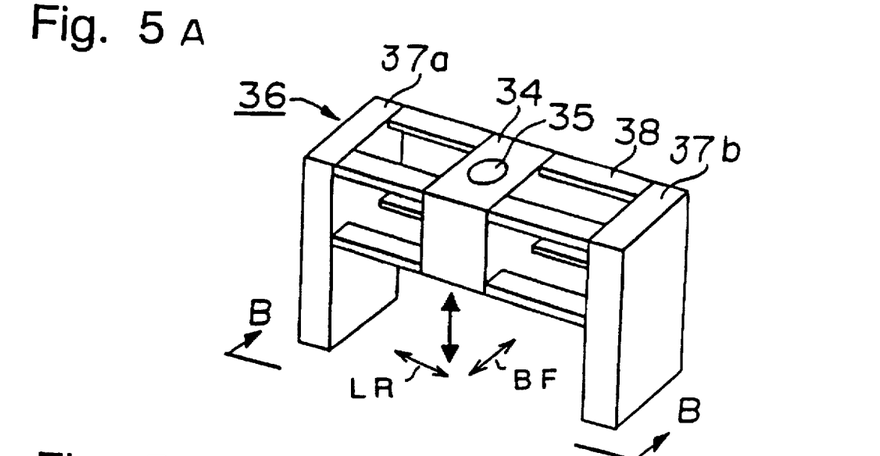
FIG. 5 depicts views illustrating the manner in which a motion-limiting unit operates in the apparatus of the invention.

Although the rotary block 22 of the loading unit 24 of FIG. 3 is effective in suppressing horizontal component of load toward the weight sensors 9 in radial direction relative to the above-mentioned center O, it is sometimes difficult to prevent horizontal force from acting on the weight sensor 9 in a direction perpendicular to the radial direction. Referring to FIG. 5, for suppression of horizontal force in all directions, an intermediary member 34 held by a motion-limiting unit 36 can be inserted between the holding-table 10 and the weight sensors 9. The motion-limiting unit 36 allows the movement of the intermediary member 34 only in the vertical direction, which is perpendicular to the mounting surface 14 of the mounting-platform 13, as shown by the heavy solid arrow of FIG. 5(A) and hollow arrows U and D of FIG. 5(D).

The illustrated motion-limiting unit 36 comprises a pair of columns 37a, 37b, and an intermediary member 34 which is substantially rigidly connected to the columns 37a, 37b by leaf springs 38 while allowing only vertical displacement. The pair of columns 37a, 37b rise from the mounting-platform 13 at opposite sides of the weight sensor 9, and are aligned with the above-mentioned radial direction passing the weight sensor 9 to be held between the columns. The leaf springs 38 extend in parallel to the mounting surface 14 of the mounting-platform 13, so as to hold the intermediary member 34 horizontal so that its central recess 35 faces vertically upward and is engageable with the spherical surface portion of the insert 17. The lower surface of the intermediary member 34 is coupled to the weight sensor 9 through the insert 17 with a spherical surface portion, while the upper surface of the intermediary member 34 is coupled to the holding-table 10 through the rotary block 22 of FIG. 3. Since the leaf springs 38 of the motion-limiting unit 36 prohibit the movement of the intermediary member 34 in the radial direction and horizontal directions perpendicular thereto, as shown by the arrows FB and LR of FIG. 5(A) and arrows R and L of FIG. 5(C), the weight sensor 9 is protected against application of forces in the radial directions and horizontal directions perpendicular thereto.

Figure 4A:
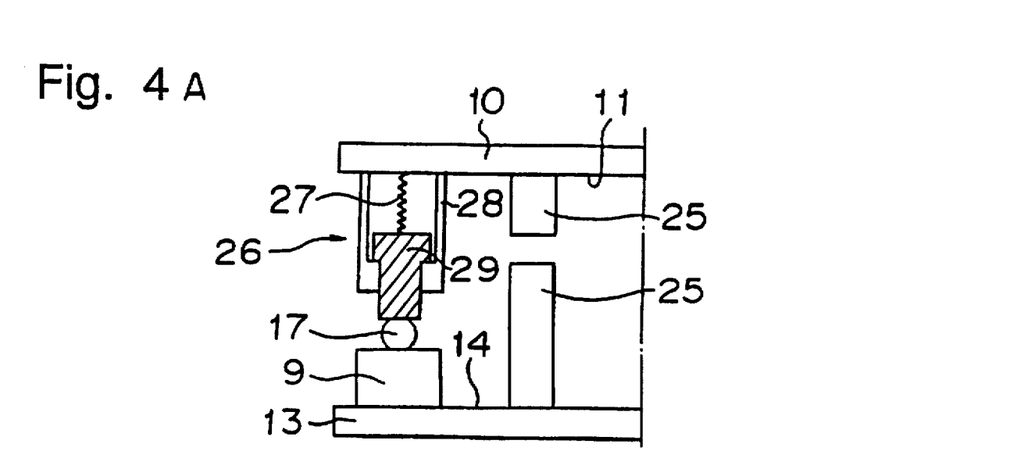
FIG. 4 shows a different embodiment of the invention which uses at least one access-restrainer.
Figure 4B:
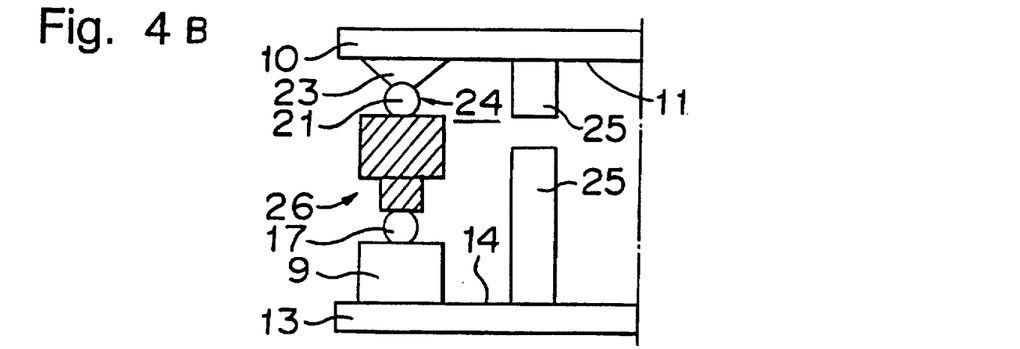

In the embodiment of FIG. 4, in order to protect the weight sensor 9 from excessively large load, access-restrainers 25 are provided which restrict the reduction of the spacing between the holding-table 10 and the mounting-platform 13 within a certain magnitude. The access-restrainers 25 of FIGS. 4(A) or 4(B) comprise a pair of facing restrainers 25; namely, a restrainer 25 secured to the bottom surface 11 of the holding-table 10 and another restrainer 25 rising from the mounting surface 14 of the mounting-platform 13, which facing restrainers 25 extending toward each other but terminate with a spacing corresponding to the above certain magnitude between the extended ends thereof. When the reduction of the spacing between the holding-table 10 and the mounting-platform 13 is going to exceed the above certain magnitude, the above-mentioned pair of facing restrainers 25 come into collision and any access causing reduction of the spacing beyond above-mentioned certain magnitude is prohibited. The details of the access-restrainer 25 are, however, not limited to the illustrated examples.

In the example of FIG. 4(A), a limiter 26 is provided between the holding-table 10 and the weight sensor 9, which comprises a resilient member 27 connected to the bottom of the holding-table 10 and being compressible by a length beyond said certain magnitude, a piston 29 connected to the lower end of the resilient member 27 and facing the weight sensor 9, and a spring chamber 28 housing both the piston 29 and the resilient member 27. With the combination of the access-restrainer 25 and the limiter 26, the weight sensor 9 is protected against application of excessively large load which can cause compression of the resilient member 27 by a length beyond said certain magnitude. FIG. 4(B) shows another embodiment in which the limiter 26 of FIG. 4(A) is connected to the rotary shaft 21; namely, the rotary member 22 of FIG. 3 is replaced with the limiter 26.

Figure 4C:
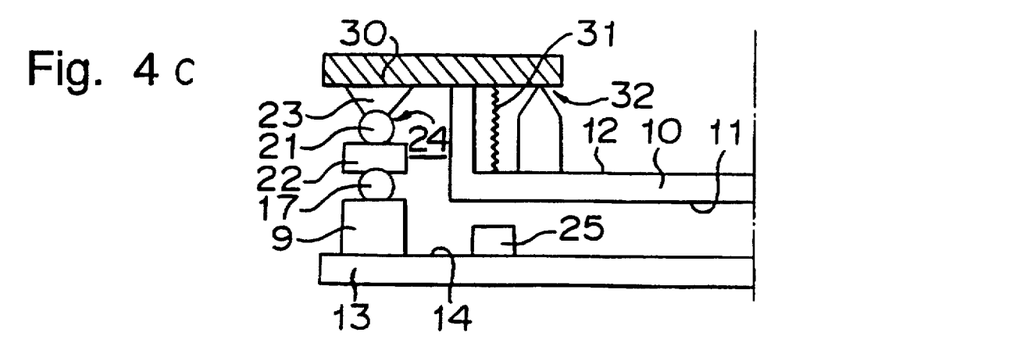

In the embodiment of FIG. 4(C), at least one extension member 30 is provided above the top surface 12 of the holding-table 10, the intermediate portion of the extension member 30 being connected to the holding-table 10 by a resilient member 31 being extensible by a length beyond said certain magnitude and outer end of the extension member 30 extending outwardly beyond the outer edge of the mounting-table 10 so as to face the top of the weight sensor 9. Referring to both FIG. 4(C) and FIG. 3, the extension member 30 is coupled to the holding-table 10 by the resilient member 31, and the loading unit 24 of FIG. 3 is secured to the bottom surface of the extended end of the extension member 30 so as to engage the weight sensor 9. Thus, the gravity acting on the mounting-table 10 is transmitted to the weight sensor 9 through the extension member 30. The inner end of the extension member 30 of FIG. 4(C) is supported at a fulcrum 32 formed by a stud rising from the mounting-table 10, so that the extension member 30 may be treated as a lever which has an effort at the joint with the resilient member 31 and a load at the joint with the loading block 24. With such lever, as the resilient member 31, which is a spring in this case, elongates the force acting on the effort increases, and the load acting on the weight sensor 9 increases accordingly. The elongation of the resilient member 31 is, however, restricted by the access-restrainer 25, and the load acting on the weight sensor 9 is prevented from become excessively large. It is also possible to pivotally support the base side end of an extension member 30 by the outer edge of the mounting-table 10 and to let the extension member 30 to extend toward the center of the mounting-table 10, so as to cause the extension member 30 thus extended to face the weight sensor 9.

Figure 6:
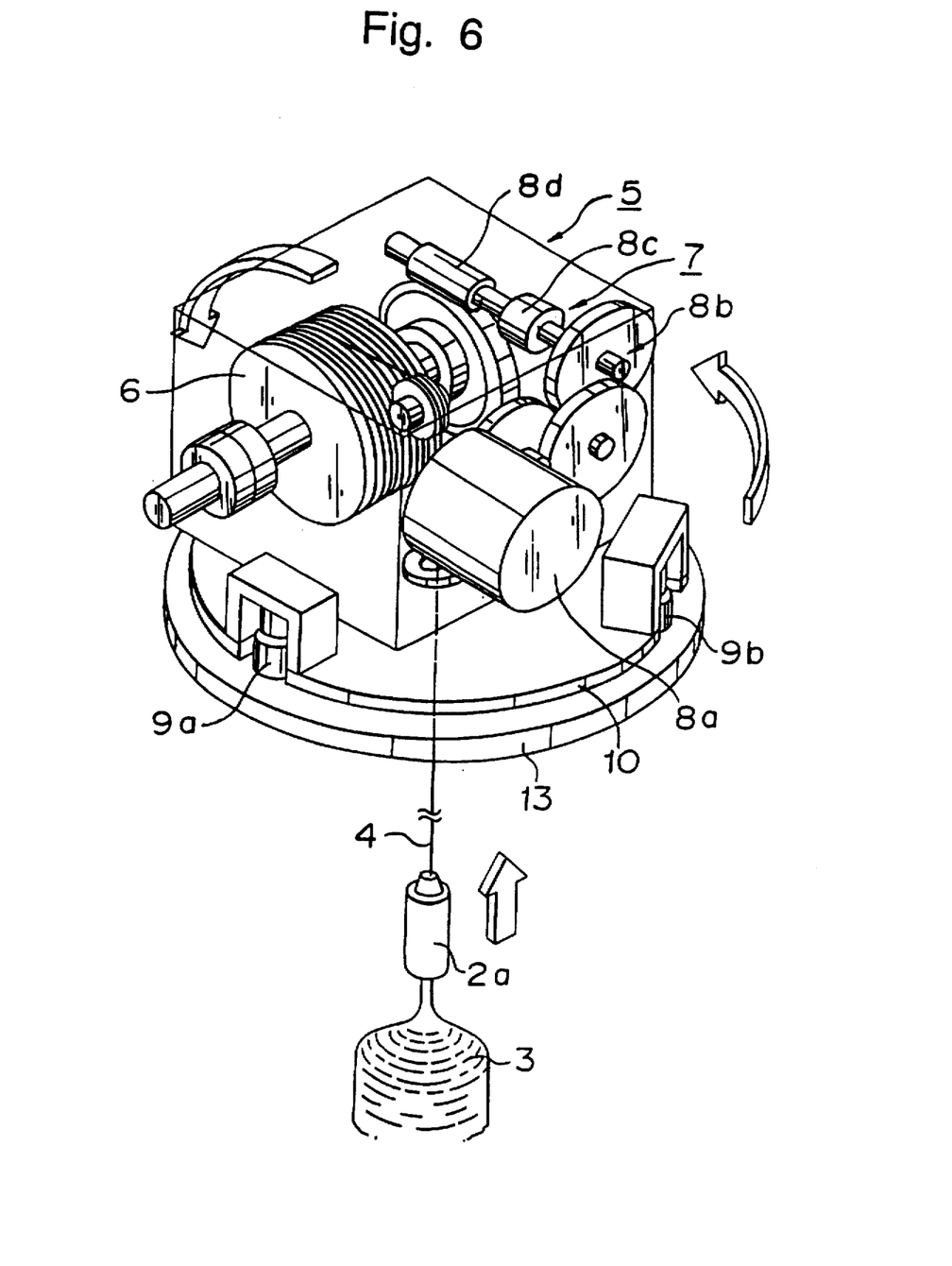
FIG. 6 is schematic perspective view, showing assembly of various elements in the apparatus of the invention.

FIG. 6 is a perspective view of an assembly of various elements of the weighing apparatus of the invention. The driver 7 in this assembly includes a motor 8a, a gear train 8b, a torque limiter 8c and a worm gear 8d, and the driving force of the motor 8a is successively transmitted to the drum 6 so as to rotate it. The driver 7 and the drum 6 are mounted on a disk-like holding-table 10, and the bottom surface 11 of the holding-table 10 engages the weight sensors 9a, 9b and 9c secured to the disk-shaped mounting-platform 13. Through holes 16 and 15 are bored through the holding-table 10 and the mounting-platform 13, respectively. The rope 4 paid out from the drum 6 extends through a pulley and depends vertically through the holes 15 and 16.

Figure 7:
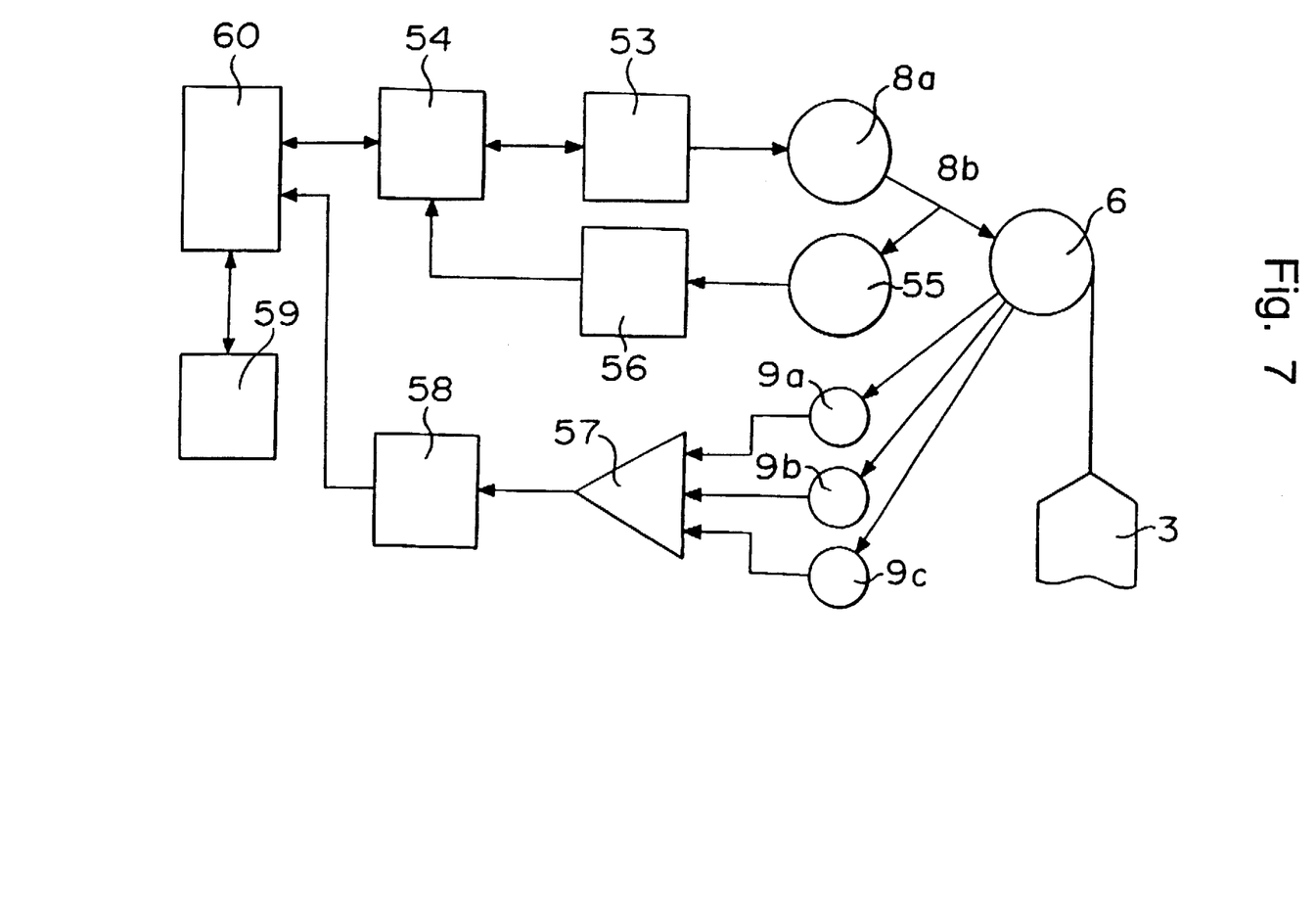
FIG. 7 is a block diagram of a machine for producing crystal which uses the apparatus of the invention.

FIG. 7 is the block diagram of an example of crystal producing machine using the crystal weighing apparatus of FIG. 6. The measured value output from the weight sensors 9a, 9b and 9c is delivered to a computer 60 through an amplifier 57 and an A/D converter 58, and the diameter of the grown crystal 3 is determined by computation. A memory 59 stores the computing program and the measured data. The computer 60 delivers driving signals for the motor 8a, which signals are delivered to the motor controller 53 through an interface 54. As a result, the rotation of the drum 6, namely, the pulling speed of the grown crystal 3 is controlled. The rotation of the gear train 8b is fed back to the interface 54 through an encoder 55 and a receiver 56.

INDUSTRIAL APPLICABILITY

As described in detail in the foregoing, the apparatus of the invention for weighing a grown crystal being pulled uses a rope connected to the grown crystal at the lower end thereof, a rope-winding unit including a drum for winding the rope and a driver for driving the drum, and a weight-measuring means for measuring the magnitude of the gravity acting on the rope-winding unit, and the apparatus determines the weight of the grown crystal by subtracting the sum of the weights of the rope and the rope-winding unit from the magnitude of the gravity as measured by the weight-measuring means, so that the following outstanding effects can be achieved.

(1) The weight of the grown crystal can be accurately measured as the crystal is being pulled by a rope.
(2) Since the increment of the weight of the crystal is accurately measured, the diameter of the grown crystal at its boundary with its melt can be accurately determined.
(3) Actual practicing of Czochralsky Process is facilitated, because the weight of a grown crystal which is being pulled by a rope can be accurately measured and the size of apparatus for producing crystal can be reduced as compared with conventional apparatus using a pulling rod.

We claim:

1. Apparatus for weighing a grown crystal that is being pulled from melt thereof, said apparatus comprising a rope of known weight having a lower end connected to the crystal, a rope-winding unit of known weight including a drum connected to an upper end of the rope and a driver coupled to the drum so as to rotate the drum for winding the rope thereon, a holding-table of known weight holding the rope-winding unit and the driver, a mounting-platform which has a mounting surface confronting bottom surface of the holding table and a through hole where depending portion of the rope extends and reciprocates vertically, and a weight-measuring means including a plurality of weight sensors being mounted on the mounting-platform so as to support the holding-table from below at such positions that the rope is registered at the center of the through hole, the weight-measuring means determining the magnitude of gravity acting on the holding-table, whereby the weight of the grown crystal is determined by subtracting sum of the known weights of the rope, the rope-winding unit, and the holding-table from the measured magnitude of gravity acting on the holding-table.

2. Apparatus as set forth in claim 1, wherein said apparatus further comprises the same number of inserts with a spherical surface portion as that of said weight sensors, each of the inserts being placed between corresponding one of the weight sensors and the bottom surface of the holding-table so that the spherical surface portion of each insert comes in slidable contact with either the weight sensor or the bottom surface of the holding-table.

3. Apparatus as set forth in claim 2 wherein the same number of radial grooves as that of said weight sensors are formed on the bottom surface of the holding-table in radial direction from cross point of pulling direction of the rope and said bottom surface, and either top end of the weight sensor or the spherical surface portion of the insert is placed in corresponding one of the radial grooves.

4. Apparatus as set forth in claim 1 wherein the same number of loading units as that of the weight sensors are formed on the bottom surface of the holding-table, each loading unit including a horizontal rotary shaft carried by the holding-table so as to be rotatable about an axis that is tangential to a circle about cross point of pulling direction of the rope and said bottom surface and a rotary block that is integrally secured to lower part of the rotary shaft, either top end of the weight sensor or the spherical surface portion of the insert is in slidable contact with the rotary block of the loading unit.

5. Apparatus as set forth in claim 1, wherein either the position of the weight sensor on the mounting-platform or the position of the loading units on the holding-table is made adjustable.

6. Apparatus as set forth in claim 1, wherein an access-restrainer is secured either to the holding-table or to the mounting-platform so as to restrain decrease of spacing between the holding-table and the mounting-platform within a certain magnitude, and a resilient member is connected between the holding-table and the mounting-platform, the resilient member being compressible by a length which is larger than said certain magnitude.

7. Apparatus as set forth in claim 1, wherein access-restrainers are secured to both of the holding-table and the mounting-platform so as to restrain decrease of spacing between the holding-table and the mounting-platform within a certain magnitude, and a resilient member is connected between the holding-table and the mounting-platform, the resilient member being compressible by a length which is larger than said certain magnitude.

8. Apparatus as set forth in claim 1, wherein an access-restrainer is secured either to the holding-table or to the mounting-platform so as to restrain decrease of spacing between the holding-table and the mounting-platform within a certain magnitude, and the same number of extension levers as that of the weight sensors are pivotally supported at inner ends thereof by studs rising from top surface of the holding-table in such manner that each extension lever extends horizontally beyond edge of the holding-table and engages corresponding one of the weight sensors at outer end thereof, and a resilient member is connected between intermediate portion of the extension lever and the holding-table, the resilient member being compressible by a length which is larger than said certain magnitude.

9. Apparatus as set forth in claim 1, wherein access-restrainers are secured to both of the holding-table and the mounting-platform so as to restrain decrease of spacing between the holding-table and the mounting-platform within a certain magnitude, and the same number of extension levers as that of the weight sensors are pivotally supported at inner ends thereof by studs rising from top surface of the holding-table in such manner that each extension lever extends horizontally beyond edge of the holding-table and engages corresponding one of the weight sensors at outer end thereof, and a resilient member is connected between intermediate portion of the extension lever and the holding-table, the resilient member being compressible by a length which is larger than said certain magnitude.

10. Apparatus as set forth in claim 1 wherein an intermediary member is placed on top of each weight sensor so that the gravity acting on the holding-plate is applied to the weight sensor through the intermediary member, and the intermediary member is held by a motion-limiting unit which is mounted on the mounting-platform so as to allow motion of the intermediary member substantially only in vertical direction.

11. Apparatus as set forth in claim 2, wherein the same number of radial grooves as that of said weight sensors are formed on the bottom surface of the holding-table in radial direction from cross point of pulling direction of the rope and said bottom surface, and either top end of the weight sensor or the spherical surface portion of the insert is placed in corresponding one of the radial grooves.

12. Apparatus as set forth in claim 2, wherein the same number of loading units as that of the weight sensors are formed on the bottom surface of the holding-table, each loading unit including a horizontal rotary shaft carried by the holding-table so as to be rotatable about an axis that is tangential to a circle about cross point of pulling direction of the rope and said bottom surface and a rotary block that is integrally secured to lower part of the rotary shaft, either top end of the weight sensor or the spherical surface portion of the insert is in slidable contact with the rotary block of the loading unit.

13. Apparatus as set forth in claim 2, wherein either the position of the weight sensor on the mounting-platform or the position of the loading units on the holding-table is made adjustable.

14. Apparatus as set forth in claim 2, wherein an access-restrainer is secured to either the holding-table or to the mounting-platform so as to restrain decrease of spacing between the holding-table and the mounting-platform within a certain magnitude, and a resilient member is connected between the holding-table and the mounting-platform, the resilient member being compressible by a length which is larger than said certain magnitude.

15. Apparatus as set forth in claim 2, wherein access-restrainers are secured to both of the holding-table and the mounting-platform so as to restrain decrease of spacing between the holding-table and the mounting-platform within a certain magnitude, and a resilient member is connected between the holding-table and the mounting-platform, the resilient member being compressible by a length which is larger than said certain magnitude.

16. Apparatus as set forth in claim 2, wherein an access-restrainer is secured either to the holding-table or to the mounting-platform so as to restrain decrease of spacing between the holding-table and the mounting-platform within a certain magnitude, and the same number of extension levers as that of the weight sensors are pivotally supported at inner ends thereof by studs rising from top surface of the holding-table in such manner that each extension lever extends horizontally beyond edge of the holding-table and engages corresponding one of the weight sensors at outer end thereof, and a resilient member is connected between intermediate portion of the extension lever and the holding-table, the resilient member being compressible by a length which is larger than said certain magnitude.

17. Apparatus as set forth in claim 2, wherein access-restrainers are secured both of the holding-table and the mounting-platform so as to restrain decrease of spacing between the holding-table and the mounting-platform within a certain magnitude, and the same number of extension levers as that of the weight sensors are pivotally supported at inner ends thereof by studs rising from top surfaces of the holding-table in such manner that each extension lever extends horizontally beyond edge of the holding-table and engages corresponding one of the weight sensors at outer end thereof, and a resilient member is connected between intermediate portion of the extension lever and the holding-table, the resilient member being compressible by a length which is larger than said certain magnitude.

18. Apparatus as set forth in claim 2, wherein an intermediary member is placed on top of each weight sensor so that the gravity acting on the holding-plate is applied to the weight sensor through the intermediary member, and the intermediary member is held by a motion-limiting unit which is mounted on the mounting-platform so as to allow motion of the intermediary member substantially only in vertical direction.

* * * * *